(12) United States Patent
Xu

(10) Patent No.: US 10,050,220 B2
(45) Date of Patent: *Aug. 14, 2018

(54) QUANTUM DOT LIGHT EMITTING ELEMENT INCLUDING WATER/ALCOHOL SOLUBLE CONJUGATED POLYMER BASED ELECTRON INJECTION/ELECTRON TRANSPORTING LAYER, MANUFACTURING METHOD THEREOF AND LIQUID CRYSTAL DISPLAY DEVICE

(71) Applicant: Shenzhen China Star Optoelectronics Technology Co., Ltd., Shenzhen, Guangdong (CN)

(72) Inventor: Chao Xu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 187 days.

This patent is subject to a terminal disclaimer.

(21) Appl. No.: 15/033,623

(22) PCT Filed: Feb. 18, 2016

(86) PCT No.: PCT/CN2016/074065
§ 371 (c)(1),
(2) Date: Apr. 29, 2016

(87) PCT Pub. No.: WO2017/128457
PCT Pub. Date: Aug. 3, 2017

(65) Prior Publication Data
US 2018/0047923 A1    Feb. 15, 2018

(30) Foreign Application Priority Data
Jan. 25, 2016 (CN) .......................... 2016 1 0048567

(51) Int. Cl.
*H01L 51/50* (2006.01)
*H01L 21/02* (2006.01)
(Continued)

(52) U.S. Cl.
CPC .......... *H01L 51/502* (2013.01); *G02F 1/1333* (2013.01); *H01L 21/02601* (2013.01);
(Continued)

(58) Field of Classification Search
CPC ............. H01L 51/0545; H01L 51/0036; H01L 51/0541; H01L 51/5012; H01L 51/502
See application file for complete search history.

(56) References Cited

U.S. PATENT DOCUMENTS 8,384,071 B2 * 2/2013 Yang ................... H01L 51/5048
257/13
2010/0096656 A1 4/2010 Nguyen
2010/0224859 A1 * 9/2010 Gough .................. B82Y 20/00
257/13

FOREIGN PATENT DOCUMENTS

CN          201985178 U     9/2011
CN          102263205 A     11/2011
(Continued)

OTHER PUBLICATIONS

Research Progress of Ammonium-Functionalized Conjugated Polyele Ctrolytes and Their Precursors Used in Electron Injection Layer of PLED. China Printing and Packaging Study vol. 05 No. 1 2013.2.

*Primary Examiner* — Quoc Hoang
(74) *Attorney, Agent, or Firm* — Andrew C. Cheng

(57) ABSTRACT

The present invention provides a quantum dot light emitting element, a manufacture method thereof and a liquid crystal display device. The quantum dot light emitting element comprises a substrate, an anode, a Hole Injection and Hole Transporting Layer, a quantum dot light emitting layer, an
(Continued)

100

Electron Injection and Electron Transporting layer and a cathode, and the anode is located on the substrate, and the anode and the cathode are located at the same side of the substrate, and are opposite and separately located, and the Hole Injection and Hole Transporting Layer, the quantum dot light emitting layer and the Electron Injection and Electron Transporting layer are sequentially sandwiched between the anode and the cathode, and one surface of the Hole Injection and Hole Transporting Layer is connected with the anode, wherein the Electron Injection and Electron Transporting layer comprises water/alcohol soluble conjugated polymer.

15 Claims, 3 Drawing Sheets

(51) Int. Cl.
*G02F 1/1333* (2006.01)
*H01L 33/06* (2010.01)
*H01L 49/00* (2006.01)
*H01L 31/0352* (2006.01)

(52) U.S. Cl.
CPC ...... *H01L 31/035218* (2013.01); *H01L 33/06* (2013.01); *H01L 49/006* (2013.01)

(56) References Cited

FOREIGN PATENT DOCUMENTS

| | | |
|---|---|---|
| CN | 103427030 A | 12/2013 |
| CN | 103972416 A | 8/2014 |
| CN | 104465911 A | 3/2015 |
| CN | 105140361 A | 12/2015 |
| CN | 105185919 A | 12/2015 |
| CN | 105206761 A | 12/2015 |
| WO | 2013103440 A1 | 7/2013 |

* cited by examiner

QUANTUM DOT LIGHT EMITTING ELEMENT INCLUDING WATER/ALCOHOL SOLUBLE CONJUGATED POLYMER BASED ELECTRON INJECTION/ELECTRON TRANSPORTING LAYER, MANUFACTURING METHOD THEREOF AND LIQUID CRYSTAL DISPLAY DEVICE

CROSS REFERENCE

This application claims the priority of Chinese Patent Application No. 201610048567.5, entitled "Quantum dot light emitting element, manufacture method thereof and liquid crystal display device", filed on Jan. 25, 2016, the disclosure of which is incorporated herein by reference in its entirety.

FIELD OF THE INVENTION

The present invention relates to a display panel technology field, and more particularly to a quantum dot light emitting element, a manufacture method thereof and a liquid crystal display device.

BACKGROUND OF THE INVENTION

The quantum dot light emitting element, such as Quantum dot Light Emitting Diode (QLED), possesses benefits of wide color gamut, high color purity, great stability, low power consumption and low cost, and is known as the next generation lighting element after the organic light emitting element. The Quantum dot Light Emitting Diode comprises a quantum dot light emitting layer, a Hole Transporting layer and an Electron Transporting layer. The Electron Transporting layer, the quantum dot light emitting layer and the Hole Transporting layer sequentially stack up. The Electron Transporting layer, the quantum dot light emitting layer and the Hole Transporting layer are generally to solve the corresponding materials in the organic solvents, and then to individually form wet films by spin coating. Namely, the Electron Transporting layer, the quantum dot light emitting layer and the Hole Transporting layer are respectively manufactured with three layers. Commonly, one layer is first manufactured, and then the other layer is formed. Because the organic solvent will be utilized as forming films, in the manufacture process of the Quantum dot Light Emitting Diode, the film layer during manufacture may damage to the adjacent film layer which has already been made. Accordingly, it results in the decreases of the lighting efficiency and the manufacture success rate of the Quantum dot Light Emitting Diode.

SUMMARY OF THE INVENTION

The present invention provides a quantum dot light emitting element, wherein the quantum dot light emitting element comprises a substrate, an anode, a Hole Injection and Hole Transporting Layer, a quantum dot light emitting layer, an Electron Injection and Electron Transporting layer and a cathode, and the anode is located on the substrate, and the anode and the cathode are located at the same side of the substrate, and the anode and the cathode are opposite and separately located, and the Hole Injection and Hole Transporting Layer, the quantum dot light emitting layer and the Electron Injection and Electron Transporting layer are sandwiched between the anode and the cathode, and one surface of the Hole Injection and Hole Transporting Layer is connected with the anode, and the quantum dot light emitting layer and the Electron Injection and Electron Transporting layer sequentially stack up at one surface of the Hole Injection and Hole Transporting Layer away from the anode, and one surface of the Electron Injection and Electron Transporting layer away from the quantum dot light emitting layer is connected with the cathode, and the anode is employed to provide holes, and the cathode is employed to provide electrons, and the Hole Injection and Hole Transporting Layer is employed to transport the holes to the quantum dot light emitting layer, and the Electron Injection and Electron Transporting layer is employed to transport the electrons to the quantum dot light emitting layer, and the holes and the electrons recombine in the quantum dot light emitting layer to emit light, wherein the Electron Injection and Electron Transporting layer comprises water/alcohol soluble conjugated polymer.

The water/alcohol soluble conjugated polymer comprises any one or more of PFN, PFNBr and PFNSO.

The anode comprises Indium Tin Oxide.

The Hole Injection and Hole Transporting Layer comprises PEDOT:PSS or P type metal oxide nano particles, wherein the P type metal oxide nano particle comprises any one or more of $MoO_3$, $NiO$, $V_2O_5$ and $WoO_3$.

A thickness of the Hole Injection and Hole Transporting Layer is 10-15 nm.

A thickness of the quantum dot light emitting layer is 30-40 nm.

The quantum dot light emitting layer comprises a single layer or more layers of quantum dots.

The cathode comprises Aluminum, and a thickness of the cathode is 100-150 nm.

The present invention further provides a manufacture method of a quantum dot light emitting element, wherein the manufacture method of the quantum dot light emitting element comprises:

providing a substrate;

forming a cathode on a surface of the substrate;

coating Hole Injection and Hole Transporting material on a surface of the anode away from the substrate to form a Hole Injection and Hole Transporting layer;

coating quantum dot light emitting material on a surface of the Hole Injection and Hole Transporting layer away from the anode to form a quantum dot light emitting layer;

coating Electron Injection and Electron Transporting material on a surface of the quantum dot light emitting layer away from the Hole Injection and Hole Transporting layer to form an Electron Injection and Electron Transporting layer, wherein the Electron Injection and Electron Transporting layer comprises water/alcohol soluble conjugated polymer;

depositing metal on a surface of the Electron Injection and Electron Transporting layer away from the quantum dot light emitting layer to form a cathode.

The present invention further provides a liquid crystal display device, comprises a quantum dot light emitting element in any of the aforesaid embodiments.

In comparison with prior art, the Electron Injection and Electron Transporting layer in the quantum dot light emitting element of the present invention comprises water/alcohol soluble conjugated polymer, which can be solved in a highly polar solvent, such as water or formaldehyde. The damage to the quantum dot light emitting layer as manufacturing the Electron Injection and Electron Transporting layer to form the film can be avoided. Therefore, the performance of the quantum dot light emitting element can be promoted. Furthermore, the water/alcohol soluble conjugated polymer is innoxious. No pollution to the environment exists in the production process, which is green, and environmental protective.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Embodiments of the present invention are described in detail with the technical matters, structural features, achieved objects, and effects with reference to the accompanying drawings as follows. It is clear that the described embodiments are part of embodiments of the present invention, but not all embodiments. Based on the embodiments of the present invention, all other embodiments to those of ordinary skill in the premise of no creative efforts obtained, should be considered within the scope of protection of the present invention.

Figure 1:
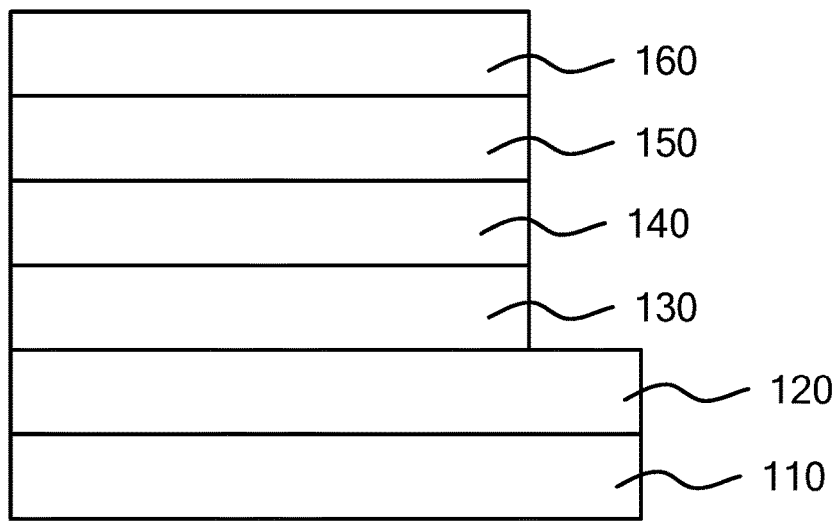
FIG. 1 is a structure diagram of a quantum dot light emitting element according to one preferred embodiment of the present invention.

Please refer to FIG. 1. FIG. 1 is a structure diagram of a quantum dot light emitting element according to one preferred embodiment of the present invention. The quantum dot light emitting element 100 comprises a substrate 110, an anode 120, a Hole Injection and Hole Transporting Layer 130, a quantum dot light emitting layer 140, an Electron Injection and Electron Transporting layer 150 and a cathode 160. The anode 120 is located on the substrate 110, and the anode 120 and the cathode 160 are located at the same side of the substrate 110, and the anode 120 and the cathode are opposite and separately located. The Hole Injection and Hole Transporting Layer 130, the quantum dot light emitting layer 140 and the Electron Injection and Electron Transporting layer 150 are sandwiched between the anode 120 and the cathode 160, and one surface of the Hole Injection and Hole Transporting Layer 130 is connected with the anode 120, and the quantum dot light emitting layer 140 and the Electron Injection and Electron Transporting layer 150 sequentially stack up at one surface of the Hole Injection and Hole Transporting Layer 130 away from the anode 120, and one surface of the Electron Injection and Electron Transporting layer 150 away from the quantum dot light emitting layer 140 is connected with the cathode 160. The anode 120 is employed to provide holes, and the cathode 160 is employed to provide electrons, and the Hole Injection and Hole Transporting Layer 130 is employed to transport the holes to the quantum dot light emitting layer 140, and the Electron Injection and Electron Transporting layer 150 is employed to transport the electrons to the quantum dot light emitting layer 140, and the holes and the electrons recombine in the quantum dot light emitting layer 140 to emit light, wherein the Electron Injection and Electron Transporting layer 150 comprises water/alcohol soluble conjugated polymer.

The water/alcohol soluble conjugated polymer (WACPs) The water/alcohol soluble conjugated polymer is employed to be material of the Electron Injection and Electron Transporting layer, which can be solved in a highly polar solvent, such as water or formaldehyde. The damage to the quantum dot light emitting layer 140 as manufacturing the Electron Injection and Electron Transporting layer 150 can be avoided. Therefore, the performance of the quantum dot light emitting element 100 can be promoted. Furthermore, the water/alcohol soluble conjugated polymer is innoxious. No pollution to the environment exists in the production process, which is green, and environmental protective.

The substrate 110 is a transparent substrate. The substrate 110 can be a glass substrate or a plastic substrate but not restricted thereto.

The anode 120 comprises Indium Tin Oxide (ITO). The cathode 160 is metal, such as Aluminum. The anode 120 is located on one surface of the substrate 110.

The Hole Injection and Hole Transporting Layer 130 comprises Poly(3,4-ethylenedioxythiophene):poly styrenesulfonate (PEDOT:PSS) or P type metal oxide nano particles. The P type metal oxide nano particle comprises any one or more of $MoO_3$, $NiO$, $V_2O_5$ and $WoO_3$. Preferably, a thickness of the Hole Injection and Hole Transporting Layer 130 is 10-15 nm.

A thickness of the quantum dot light emitting layer 140 is 30-40 nm. The quantum dot light emitting layer 140 comprises a single layer or more layers of quantum dots.

A thickness of the Electron Injection and Electron Transporting layer 150 can be 5-10 nm.

In comparison with prior art, the Electron Injection and Electron Transporting layer 150 in the quantum dot light emitting element 100 of the present invention comprises water/alcohol soluble conjugated polymer, which can be solved in a highly polar solvent, such as water or formaldehyde. The damage to the quantum dot light emitting layer 140 as manufacturing the Electron Injection and Electron Transporting layer 150 to form the film can be avoided. Therefore, the performance of the quantum dot light emitting element 100 can be promoted. Furthermore, the water/alcohol soluble conjugated polymer is innoxious. No pollution to the environment exists in the production process, which is green, and environmental protective.

Figure 2:
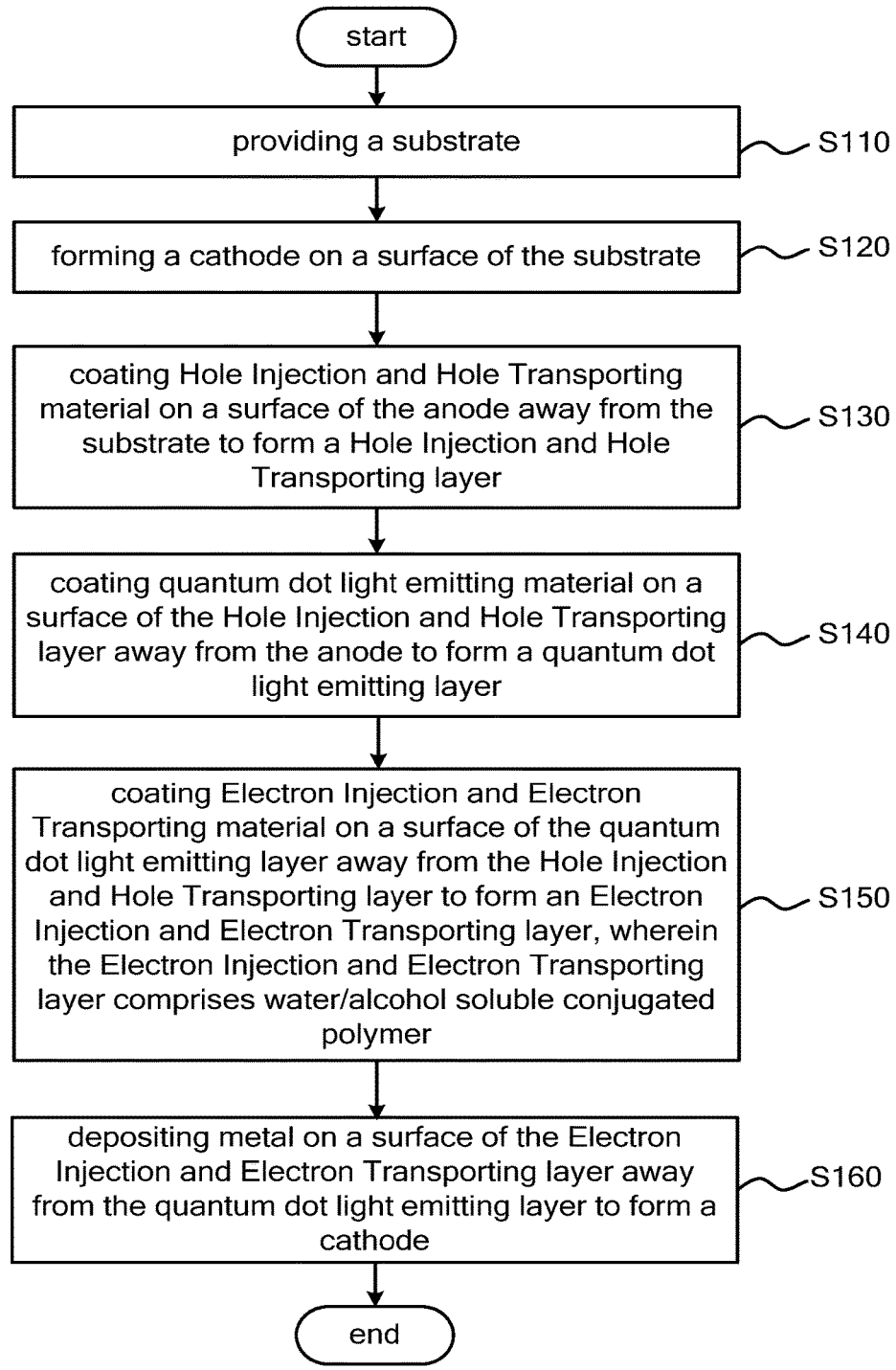
FIG. 2 is a flowchart of a manufacture method of a quantum dot light emitting element according to one preferred embodiment of the present invention.

With combination of FIG. 1 and the aforesaid introduction to the quantum dot light emitting element 100, the manufacture method of the quantum dot light emitting element according to the present invention is introduced below. Please refer to FIG. 2. FIG. 2 is a flowchart of a manufacture method of a quantum dot light emitting element according to one preferred embodiment of the present invention. The manufacture method of the quantum dot light emitting element comprises the steps below but not restricted thereto.

step S110, providing a substrate 110.

step S120, forming a cathode 120 on a surface of the substrate 110.

step S130, coating Hole Injection and Hole Transporting material on a surface of the anode 120 away from the substrate 110 to form a Hole Injection and Hole Transporting layer 130. The Hole Injection and Hole Transporting layer 130 can be formed: utilizing spin coating to coat the Hole Injection and Hole Transporting material on the surface of the anode 120 away from the substrate 110 to form the Hole Injection and Hole Transporting layer 130.

step S140, coating quantum dot light emitting material on a surface of the Hole Injection and Hole Transporting layer 130 away from the anode 120 to form a quantum dot light emitting layer 140. The quantum dot light emitting layer 140 can be formed: utilizing spin coating to coat the quantum dot light emitting material on the surface of the Hole Injection and Hole Transporting layer 130 away from the anode 120 to form the quantum dot light emitting layer 140.

step S150, coating Electron Injection and Electron Transporting material on a surface of the quantum dot light emitting layer 140 away from the Hole Injection and Hole Transporting layer 130 to form an Electron Injection and Electron Transporting layer 150, wherein the Electron Injection and Electron Transporting layer 150 comprises water/alcohol soluble conjugated polymer. The Electron Injection and Electron Transporting layer 150 can be formed: utilizing spin coating to coat the Electron Injection and Electron Transporting material on the surface of the quantum dot light emitting layer 140 away from the Hole Injection and Hole Transporting layer 130 to form the Electron Injection and Electron Transporting layer 150.

step S160, depositing metal on a surface of the Electron Injection and Electron Transporting layer 150 away from the quantum dot light emitting layer 140 to form a cathode 160. The manufacture method of the cathode 160 can be: utilizing evaporating or other methods to form the metal, such as Aluminum, on the surface of the Electron Injection and Electron Transporting layer 150 away from the quantum dot light emitting layer 140 to manufacture the cathode 160. A thickness of the cathode 160 is 100-150 nm.

Figure 3:
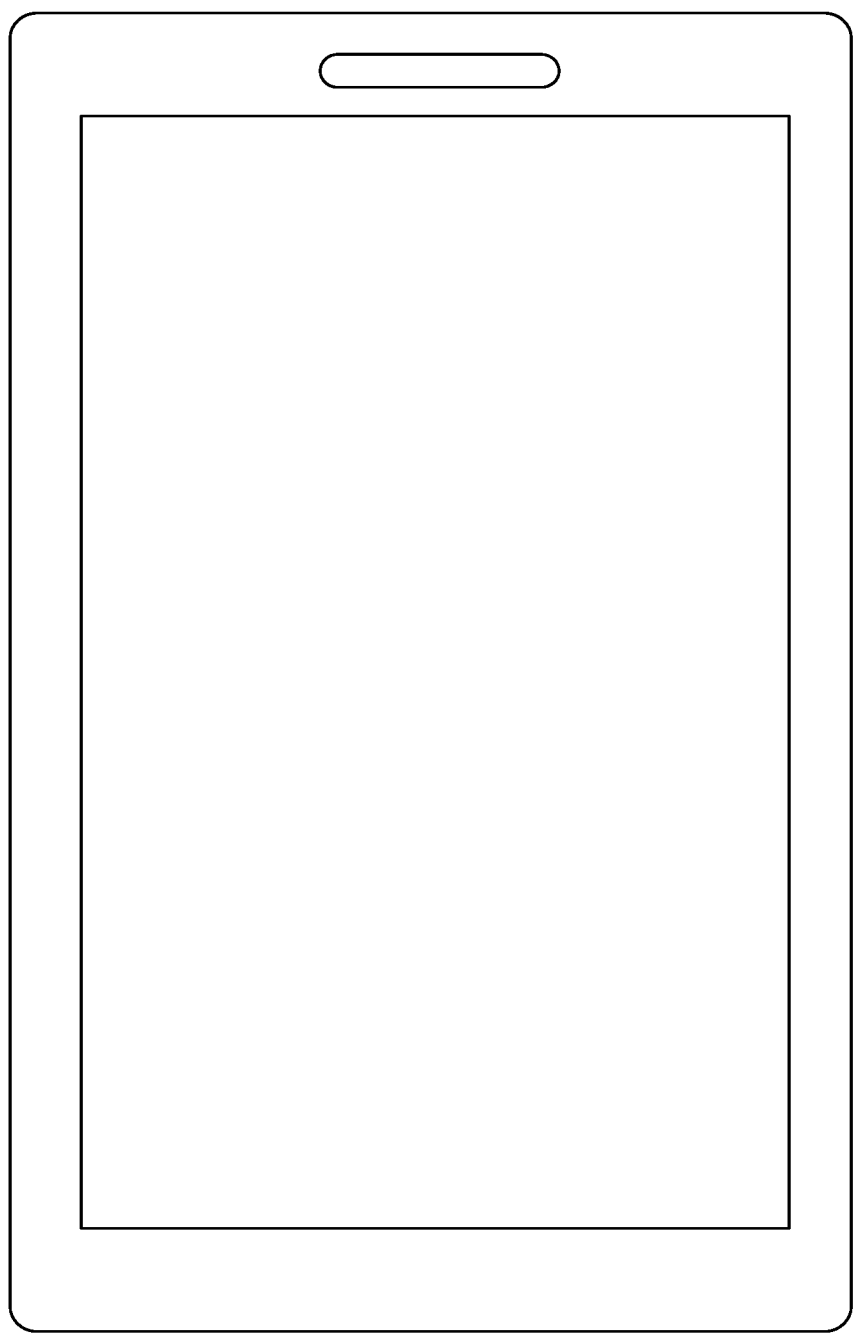
FIG. 3 is a structural diagram of a preferred embodiment according to a liquid crystal display device of the present invention.

The present invention further provides a liquid crystal display device 10. Please refer to FIG. 3. The liquid crystal display device 10 comprises the quantum dot light emitting element 100 introduced aforementioned. The repeated description is omitted here. In this embodiment, the liquid crystal display device 10 can be a portable electronic device, such as the smart phone, the mobile internet device (MID), the electronic book, the Play Station Portable (PSP) or Personal Digital Assistant (PDA) but not limited thereto, or can be a display.

Above are embodiments of the present invention, which does not limit the scope of the present invention. Any modifications, equivalent replacements or improvements within the spirit and principles of the embodiment described above should be covered by the protected scope of the invention.

What is claimed is:

1. A quantum dot light emitting element, wherein the quantum dot light emitting element comprises a substrate, an anode, a Hole Injection and Hole Transporting Layer, a quantum dot light emitting layer, an Electron Injection and Electron Transporting layer and a cathode, and the anode is located on the substrate, and the anode and the cathode are located at the same side of the substrate, and the anode and the cathode are opposite and separately located, and the Hole Injection and Hole Transporting Layer, the quantum dot light emitting layer and the Electron Injection and Electron Transporting layer are sandwiched between the anode and the cathode, and one surface of the Hole Injection and Hole Transporting Layer is connected with the anode, and the quantum dot light emitting layer and the Electron Injection and Electron Transporting layer sequentially stack up at one surface of the Hole Injection and Hole Transporting Layer away from the anode, and one surface of the Electron Injection and Electron Transporting layer away from the quantum dot light emitting layer is connected with the cathode, and the anode is employed to provide holes, and the cathode is employed to provide electrons, and the Hole Injection and Hole Transporting Layer is employed to transport the holes to the quantum dot light emitting layer, and the Electron Injection and Electron Transporting layer is employed to transport the electrons to the quantum dot light emitting layer, and the holes and the electrons recombine in the quantum dot light emitting layer to emit light, wherein the Electron Injection and Electron Transporting layer comprises water/alcohol soluble conjugated polymer;

wherein the water/alcohol soluble conjugated polymer comprises one of PFNBr (Bromine Polyfluorene) and PFNSO (Sulfo-Polyfluorene).

2. The quantum dot light emitting element according to claim 1, wherein the anode comprises Indium Tin Oxide.

3. The quantum dot light emitting element according to claim 1, wherein the Hole Injection and Hole Transporting Layer comprises PEDOT:PSS or P type metal oxide nano particles, wherein the P type metal oxide nano particle comprises any one or more of $MoO_3$, $NiO$, $V_2O_5$ and $WoO_3$.

4. The quantum dot light emitting element according to claim 1, wherein a thickness of the Hole Injection and Hole Transporting Layer is 10-15 nm.

5. The quantum dot light emitting element according to claim 1, wherein a thickness of the quantum dot light emitting layer is 30-40 nm.

6. The quantum dot light emitting element according to claim 1, wherein the quantum dot light emitting layer comprises a single layer or more layers of quantum dots.

7. The quantum dot light emitting element according to claim 1, wherein the cathode comprises Aluminum, and a thickness of the cathode is 100-150 nm.

8. A manufacture method of a quantum dot light emitting element, wherein the manufacture method of the quantum dot light emitting element comprises:
providing a substrate;
forming a cathode on a surface of the substrate;
coating Hole Injection and Hole Transporting material on a surface of an anode away from the substrate to form a Hole Injection and Hole Transporting layer;
coating quantum dot light emitting material on a surface of the Hole Injection and Hole Transporting layer away from the anode to form a quantum dot light emitting layer;
coating Electron Injection and Electron Transporting material on a surface of the quantum dot light emitting layer away from the Hole Injection and Hole Transporting layer to form an Electron Injection and Electron Transporting layer, wherein the Electron Injection and Electron Transporting layer comprises water/alcohol soluble conjugated polymer;
depositing metal on a surface of the Electron Injection and Electron Transporting layer away from the quantum dot light emitting layer to form the cathode;
wherein the water/alcohol soluble conjugated polymer comprises one of PFNBr (Bromine Polyfluorene) and PFNSO (Sulfo-Polyfluorene).

9. A liquid crystal display device, wherein the liquid crystal display device comprises a quantum dot light emitting element, and the quantum dot light emitting element comprises a substrate, an anode, a Hole Injection and Hole Transporting Layer, a quantum dot light emitting layer, an Electron Injection and Electron Transporting layer and a cathode, and the anode is located on the substrate, and the anode and the cathode are located at the same side of the substrate, and the anode and the cathode are opposite and separately located, and the Hole Injection and Hole Transporting Layer, the quantum dot light emitting layer and the Electron Injection and Electron Transporting layer are sandwiched between the anode and the cathode, and one surface of the Hole Injection and Hole Transporting Layer is connected with the anode, and the quantum dot light emitting layer and the Electron Injection and Electron Transporting layer sequentially stack up at one surface of the Hole Injection and Hole Transporting Layer away from the anode, and one surface of the Electron Injection and Electron Transporting layer away from the quantum dot light emitting layer is connected with the cathode, and the anode is employed to provide holes, and the cathode is employed to provide electrons, and the Hole Injection and Hole Transporting Layer is employed to transport the holes to the quantum dot light emitting layer, and the Electron Injection and Electron Transporting layer is employed to transport the electrons to the quantum dot light emitting layer, and the holes and the electrons recombine in the quantum dot light emitting layer to emit light, wherein the Electron Injection and Electron Transporting layer comprises water/alcohol soluble conjugated polymer;

wherein the water/alcohol soluble conjugated polymer comprises one of PFNBr (Bromine Polyfluorene) and PFNSO (Sulfo-Polyfluorene).

10. The liquid crystal display device according to claim 9, wherein the anode comprises Indium Tin Oxide.

11. The liquid crystal display device according to claim 9, wherein the Hole Injection and Hole Transporting Layer comprises PEDOT:PSS or P type metal oxide nano particles, wherein the P type metal oxide nano particle comprises any one or more of MoO3, NiO, V2O5 and WoO3.

12. The liquid crystal display device according to claim 9, wherein a thickness of the Hole Injection and Hole Transporting Layer is 10-15 nm.

13. The liquid crystal display device according to claim 9, wherein a thickness of the quantum dot light emitting layer is 30-40 nm.

14. The liquid crystal display device according to claim 9, wherein the quantum dot light emitting layer comprises a single layer or more layers of quantum dots.

15. The liquid crystal display device according to claim 9, wherein the cathode comprises Aluminum, and a thickness of the cathode is 100-150 nm.

* * * * *